(12) United States Patent
Kuge et al.

(10) Patent No.: US 9,076,685 B2
(45) Date of Patent: Jul. 7, 2015

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Nobuhito Kuge, Mie-ken (JP); Tsukasa Nakai, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/018,851

(22) Filed: Sep. 5, 2013

(65) Prior Publication Data

US 2014/0346585 A1    Nov. 27, 2014

(30) Foreign Application Priority Data

May 22, 2013   (JP) ................. 2013-108059

(51) Int. Cl.
 *H01L 29/792*    (2006.01)
 *H01L 27/115*    (2006.01)
 *H01L 29/423*    (2006.01)
 *H01L 29/66*    (2006.01)
(52) U.S. Cl.
 CPC ..... *H01L 27/11582* (2013.01); *H01L 27/11519* (2013.01); *H01L 29/4234* (2013.01); *H01L 29/66833* (2013.01); *H01L 29/7926* (2013.01)
(58) Field of Classification Search
 CPC .................. H01L 27/11568; H01L 27/11578; H01L 27/11582

USPC .......................................... 257/324; 438/287
See application file for complete search history.

(56) References Cited

U.S. PATENT DOCUMENTS

| | | | |
|---|---|---|---|
| 7,847,342 B2 | 12/2010 | Fukuzumi et al. | |
| 7,952,136 B2 | 5/2011 | Kito et al. | |
| 8,318,602 B2 | 11/2012 | Kito et al. | |
| 8,372,720 B2 | 2/2013 | Fukuzumi et al. | |
| 2008/0099819 A1* | 5/2008 | Kito et al. | 257/315 |
| 2009/0146206 A1 | 6/2009 | Fukuzumi et al. | |
| 2010/0207195 A1 | 8/2010 | Fukuzumi et al. | |
| 2013/0113032 A1* | 5/2013 | Matsuda et al. | 257/324 |
| 2013/0126961 A1 | 5/2013 | Fukuzumi et al. | |

FOREIGN PATENT DOCUMENTS

| | | |
|---|---|---|
| JP | 2009-135324 | 6/2009 |
| WO | WO 2009/075370 A1 | 6/2009 |

* cited by examiner

*Primary Examiner* — Tu-Tu Ho
(74) *Attorney, Agent, or Firm* — Oblon, McClelland, Maier & Neustadt, L.L.P.

(57) ABSTRACT

According to one embodiment, a semiconductor memory device includes a lower gate layer, a stacked body including a plurality of electrode layers and a plurality of insulating layers, alternately stacked on the lower gate layer, a channel body extending within the stacked body from the topmost electrode layer to the lower gate layer, and a memory film provided between the electrode layer and the channel body. The memory film includes a charge storage film. The electrode layer includes a step portion in which a step is formed in a stacking direction of the stacked body. The channel body and the memory film pass through the step portion.

11 Claims, 8 Drawing Sheets

SEMICONDUCTOR MEMORY DEVICE AND METHOD FOR MANUFACTURING THE SAME

CROSS-REFERENCE TO RELATED APPLICATION

This application is based upon and claims the benefit of priority from Japanese Patent Application No. 2013-108059, filed on May 22, 2013; the entire contents of which are incorporated herein by reference.

FIELD

Embodiments described herein relate generally to a semiconductor memory device and a method for manufacturing the same.

BACKGROUND

A three-dimensionally arrayed memory device is proposed in which a memory hole is formed in a stacked body that includes a plurality of electrode layers, which function as a control gate in a memory cell, and a plurality of insulating layers between electrode layers, the electrode layers and the insulating layers being stacked alternately with each other, and a silicon body is provided to be a channel in a sidewall of the memory hole via a charge storage film.

It is difficult to form an impurity diffused layer so that the channel of the memory cell transistor of this type of three-dimensionally arrayed device is a vertical type. Also, there are restrictions on increasing the impurity concentration of the silicon body due to restrictions on the threshold voltage of the select transistor or the like. Therefore, the key to increasing the cell current is how to reduce the channel resistance of a portion (between electrode layers) that is not opposite the electrode layer.

BRIEF DESCRIPTION OF THE DRAWINGS

FIG. 3A to FIG. 5B are schematic cross-sectional views showing a method for manufacturing the semiconductor memory device according to the embodiment;

DETAILED DESCRIPTION

According to one embodiment, a semiconductor memory device includes a lower gate layer, a stacked body including a plurality of electrode layers and a plurality of insulating layers, alternately stacked on the lower gate layer, a channel body extending within the stacked body from the topmost electrode layer to the lower gate layer, and a memory film provided between the electrode layer and the channel body. The memory film includes a charge storage film. The electrode layer includes a step portion in which a step is formed in a stacking direction of the stacked body. The channel body and the memory film pass through the step portion.

Embodiments will be described below with reference to drawings. Note that the same reference numerals are applied for the same elements in each drawing.

Figure 1:
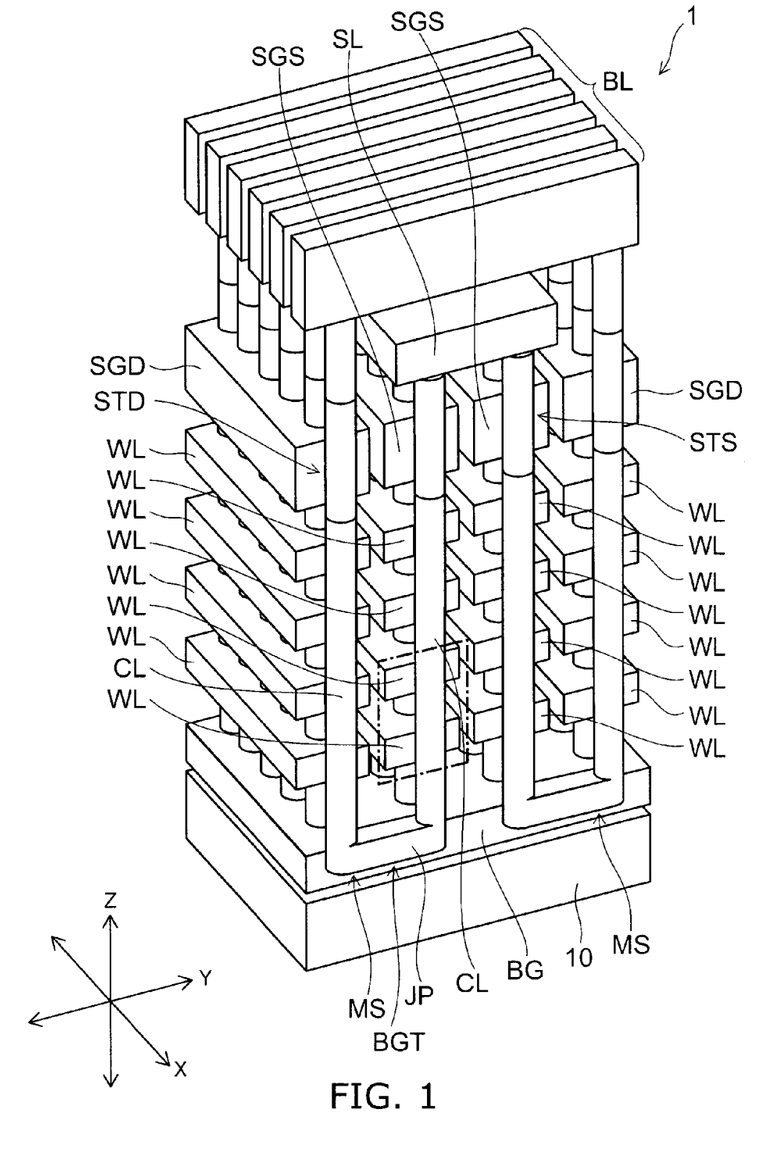
FIG. 1 is a schematic perspective view of a semiconductor memory device according to an embodiment.

FIG. 1 is a schematic perspective view of a memory cell array 1 of a semiconductor memory device according to an embodiment.

Figure 2:
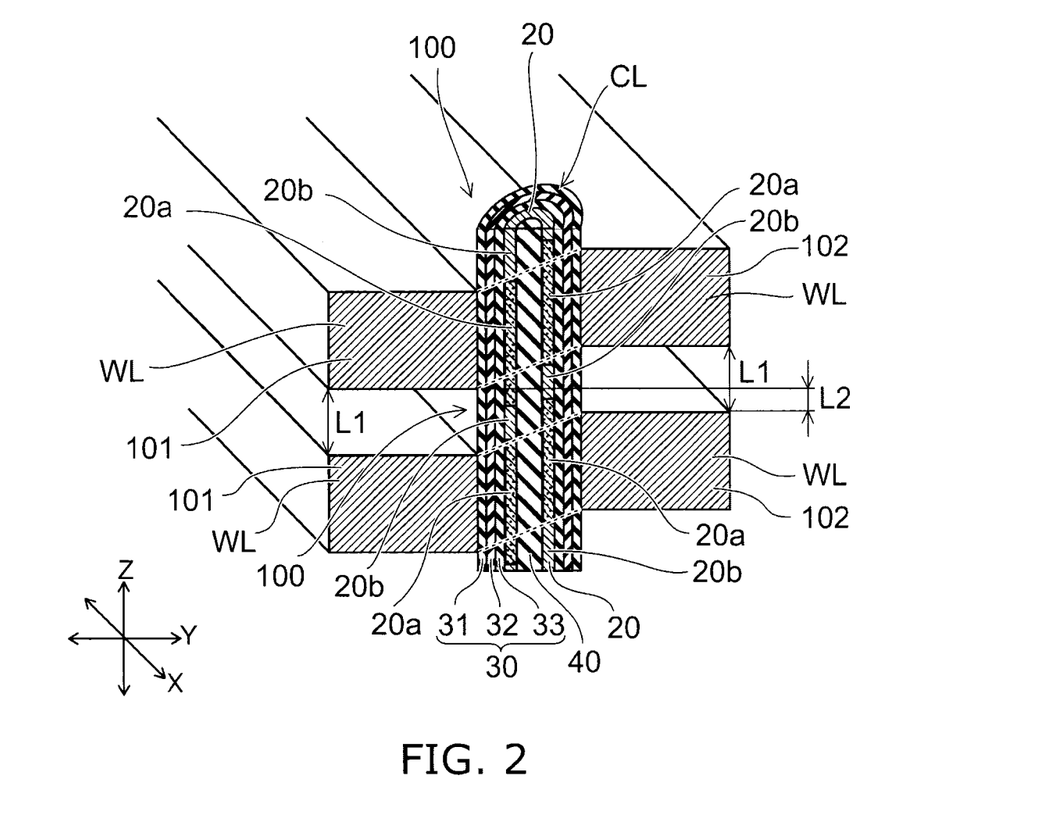
FIG. 2 is an enlarged schematic view of a memory cell of the semiconductor memory device according to the embodiment.

FIG. 2 is an enlarged schematic view of a portion enclosed by the dotted and dashed line in FIG. 1.

In FIGS. 1 and 2, insulating layers between electrode layers WL have been omitted for ease of understanding the drawing.

Also, two mutually perpendicular directions parallel to a major surface of a substrate 10 are defined as a Y direction (first direction) and an X direction (second direction), and a direction perpendicular to both the Y direction and the X direction is defined as a Z direction (third direction or stacking direction).

A memory cell array 1 of the embodiment includes a stacked body that includes a plurality of electrode layers WL and a plurality of insulating layers 55 (illustrated in FIG. 5B), each of the electrode layers WL and each of the insulating layers 55 are stacked alternately. The stacked body is provided on a back gate BG as a lower gate layer. The number of layers of the electrode layer WL illustrated on the drawings is an example, and the number of layers of the electrode layer WL is optional.

The back gate BG is provided on a substrate 10 via an insulating layer. The back gate BG and the electrode layer WL are conductive layers, for example, silicon layers to which impurities have been added.

The memory cell array 1 includes a plurality of memory strings MS. A single memory string MS is formed in a U-shape and includes a pair of columns CL extending in the Z direction, and a connecting portion JP that connects bottom ends of each of the pair of columns CL.

A drain side selection gate SGD is provided on a top end of one of the pair of columns CL in the U-shaped memory string MS, and a source side selection gate SGS is provided on a top end of the other. The drain side selection gate SGD and the source side selection gate SGS are provided above the topmost layer of the electrode layers WL via an insulating layer.

The drain side selection gate SGD and the source side selection gate SGS are, for example, silicon layers to which impurities have been added.

The drain side selection gate SGD and the source side selection gate SGS are separated in the Y direction by an insulating separation film. The stacked body below the drain side selection gate SGD and the stacked body below the source side selection gate SGS are separated in the Y direction by an insulating separation film 63 as illustrated in FIG. 5B. In other words, the stacked bodies between the pair of columns CL of the memory string MS are separated in the Y direction by the insulating separation film 63.

Also, the stacked bodies between adjacent memory strings MS in the Y direction are separated by insulating separation films.

A source line (for example, a metal film) SL is provided on the source side selection gate SGS via an insulating layer. A plurality of bit lines (for example, metal films) BL is provided above the drain side selection gate SGD and the source line SL, via an insulating layer. Each bit line BL extends in the Y direction.

The memory string MS includes a channel body 20 provided within a U-shaped memory hole MH (illustrated in FIG. 5A) formed in a stacked body that includes the back gate BG, the plurality of electrode layers WL, and the plurality of insulating layers 55. The channel body 20 is, for example, a silicon film. The impurity concentration of the channel body 20 is lower than the impurity concentration of the electrode layer WL.

The channel body 20 is provided within the U-shaped memory hole MH via a memory film 30. The memory film 30 is provided between an inside wall of the memory hole MH and the channel body 20.

As illustrated in FIG. 2, the channel body 20 is provided in a cylindrical shape, and the cylindrical memory film 30 is provided so as to surround the peripheral surface of the channel body 20. The electrode layer WL surrounds the periphery of the channel body 20 via the memory film 30. Also, a core insulating film 40 is provided on an inner side of the channel body 20. The core insulating film 40 is, for example, a silicon nitride film.

The memory film 30 includes a block film 31, a charge storage film 32, and a tunnel film 33. The block film 31, the charge storage film 32, and the tunnel film 33 are provided between the electrode layer WL and the channel body 20, in that order from the electrode layer WL side. The block film 31 contacts the electrode layer WL, and the tunnel film 33 contacts the channel body 20, and the charge storage film 32 is provided between the block film 31 and the tunnel film 33.

The channel body 20 functions as a channel in the memory cell transistor (hereinafter, referred to simply as memory cell), the electrode layer WL functions as a control gate of the memory cell, and the charge storage film 32 functions as a data memory layer that accumulates a charge infused from the channel body 20. In other words, a memory cell is formed in a configuration in which a control gate encompasses the channel periphery at the location where the channel body 20 and each electrode layer WL intersect.

The semiconductor memory device of the embodiment is a non-volatile semiconductor memory device that can freely erase and write data electrically, and can retain the contents of the memory even when the power supply is turned off.

The memory cell is, for example, a charge trap type of memory cell. The charge storage film 32 includes a great number of trap sites that trap the charge, for example, a silicon nitride film, or a hafnium oxide film ($HfO_2$ film).

The tunnel film 33 is, for example, a silicon oxide film, a silicon nitride film, or a stacked film made from these films, which functions as a potential barrier when charge is infused from the channel body 20 to the charge storage film 32, or when charge accumulated in the charge storage film 32 is diffused to the channel body 20.

The block film 31 is, for example, a silicon oxide film, a silicon nitride film, an aluminum oxide film ($Al_2O_3$ film), a hafnium oxide film ($HfO_2$ film), or a stacked film that includes at least one of these films, that prevents the charge accumulated in the charge storage film 32 from diffusing to the electrode layer WL.

As illustrated in FIG. 1, a drain side select transistor STD is provided on the top end of one of the pair of columns CL, and a source side select transistor STS is provided on the top end of the other. The drain side select transistor STD and the source side select transistor STS are vertical type transistors, the same as the memory cells.

The drain side selection gate SGD functions as a gate electrode for the drain side select transistor STD. An insulating film (not illustrated) that functions as a gate insulating film for the drain side select transistor STD is provided between the drain side selection gate SGD and the channel body 20. The channel body of the drain side select transistor STD is connected to the bit line BL above the drain side selection gate SGD.

The source side selection gate SGS functions as a gate electrode for the source side select transistor STS. An insulating film (not illustrated) that functions as a gate insulating film for the source side select transistor STS is provided between the source side selection gate SGS and the channel body 20. The channel body of the source side select transistor STS is connected to the source line SL above the source side selection gate SGS.

A back gate transistor BGT is provided on the connecting portion JP of the memory string MS. The back gate BG functions as a gate electrode of the back gate transistor BGT. The memory film 30 provided within the back gate BG functions as a gate insulating film of the back gate transistor BGT.

A plurality of memory cells is provided between the drain side select transistor STD and the back gate transistor BGT with the electrode layer WL of each layer as the control gate. Likewise, a plurality of memory cells is provided between the back gate transistor BGT and the source side select transistor STS with the electrode layer WL of each layer as the control gate.

These memory cells in a plurality, the drain side select transistor STD, the back gate transistor BGT, and the source side select transistor STS are serially connected through the channel body 20 and configure a single U shaped memory string MS. This memory string MS is arrayed in plurality in the X direction and the Y direction, and therefore, a plurality of memory cells is three dimensionally provided in the X direction, Y direction, and Z direction.

A plurality of electrode layers WL is separated in the first direction (Y direction). Each of the electrode layers WL separated in the first direction (Y direction) extends in the second direction (X direction). The second direction (X direction) is a direction within a plane parallel to the major surface of the substrate 10 and that intersects (for example, is perpendicular to) the first direction (Y direction).

A plurality of columns CL of different memory strings MS is arranged in the X direction, sharing a single electrode layer WL extending in the X direction.

The electrode layer WL of each layer includes a step portion in which a step is formed in the stacking direction (Z direction) of the stacked body. As illustrated in FIG. 5B, the electrode layers WL above the connecting portion JP of the memory string MS are positioned on the lower side (back gate BG side) of the electrode layers WL above the region where the connecting portion JP is not provided.

As illustrated in FIG. 2, the electrode layer WL on the first layer includes a lower step portion 101 and an upper step portion 102 positioned so as to sandwich the column CL in the Y direction. The upper step portion 102 and the lower step portion 101 are connected via a step portion 100.

The top surface of the lower step portion 101 is positioned on the lower side (back gate BG side) than the top surface of the upper step portion 102 of the electrode layer WL of the same layer as the lower step portion 101. The bottom surface of the lower step portion 101 is positioned on the lower side (back gate BG side) than the bottom surface of the upper step portion 102 of the electrode layer WL of the same layer as the lower step portion 101.

The top surface and the bottom surface of the lower step portion 101, and the top surface and the bottom surface of the upper step portion 102 are parallel to the top surface of the back gate BG, and are not inclined.

As illustrated in FIG. 5B, each lower step portion of the electrode layer WL of the different layers is stacked in the Z direction via the insulating layers 55, and each upper step portion of the electrode layer WL of the different layers is stacked in the Z direction via the insulating layers 55.

The column CL of the memory string MS penetrates the step portion 100 of the electrode layer WL, and extends within the stacked body from the topmost electrode layer WL to the back gate BG.

As illustrated in FIG. 2, a single column CL is sandwiched in the Y direction by the lower step portion 101 that contacts the column CL on a first side, and the upper step portion 102 that contacts the column CL on a second side.

The distance L2 between the bottom surface of the lower step portion 101 of the electrode layer WL and the top surface of the upper step portion 102 of the electrode layer WL that is one layer below that electrode layer WL is less than the distance L1 between the lower step portions 101 and the distance L1 between the upper step portions 102 of the electrode layers WL.

The memory cell of the embodiment has a structure in which the periphery of the channel body 20 is surrounded by the electrode layer WL via the memory film 30. When a positive voltage is applied to the electrode layer WL, the channel is formed by electrons that form carriers in the region opposing the electrode layer WL in the channel body 20, and the resistance in the region becomes low. On the other hand, it is not possible to form a channel with sufficient electrons in the portion opposing the region between the electrode layers WL in the channel body 20, so the resistance becomes high compared with the region opposing the electrode layers WL.

In a vertical transistor structure in which channels extend in the stacking direction (vertical direction) of the stacked body stacked on the substrate, it is difficult to form an impurity diffused layer in the channel body 20, so the transistors of the memory cell must operate with channel bodies 20 without a diffusion layer. Also, increasing the impurity concentration of the channel body 20 reduces the threshold voltage of the select transistor.

When a negative voltage is applied to the gate electrode of the select transistor in order to turn this select transistor off, the scale and load of the surrounding circuit is increased. Therefore, there is a restriction that the impurity concentration of the channel body 20 is kept to a low concentration so that the select transistor is off at 0 volts, and is not increased more than is necessary.

Under these circumstances in which the impurity concentration of the channel body 20 is low, the key to increasing the cell current is how to reduce the channel resistance between the electrode layers WL.

Figure 7A:
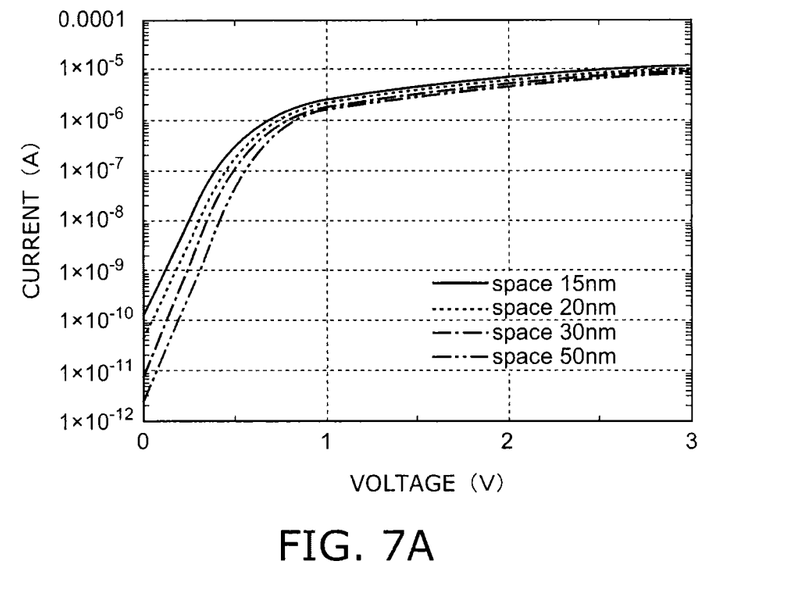
FIGS. 7A and 7B are graph showing a relationship of the space between electrode layers and the current-voltage characteristic.
Figure 7B:
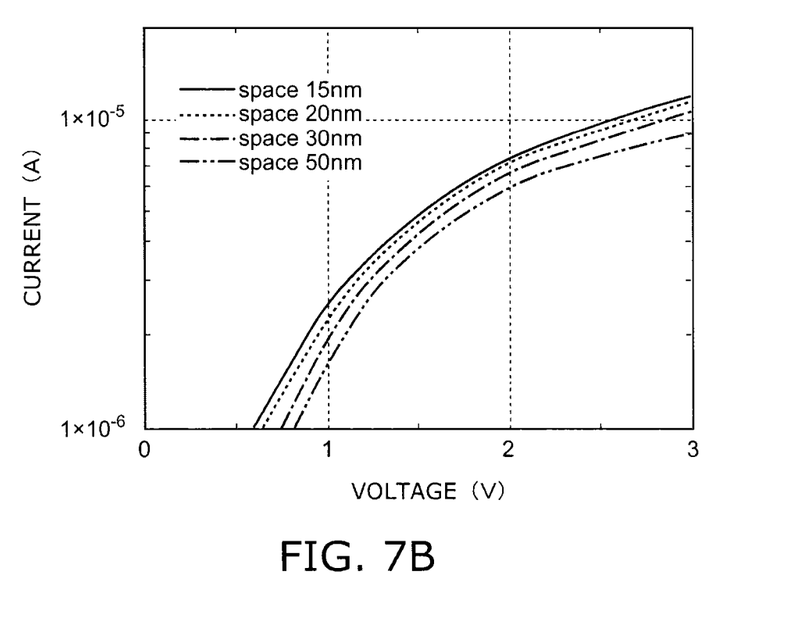

FIGS. 7A and 7B show the results obtained by device simulation for how the cell current flowing in the channel body 20 varies due to the distance between electrode layers WL (the width in the stacking direction of the space between electrode layers).

The horizontal axis represents the voltage (V) applied to the electrode layer WL. The vertical axis represents the current (A) flowing in the channel body 20.

FIG. 7B is an enlarged graph of the current values on the vertical axis of FIG. 7A in the range of from $1\times10^{-6}$ to $1\times10^{-5}$ (A).

FIGS. 7A and 7B show single logarithmic plots of the current-voltage characteristic when the distance between electrode layers WL (the width of the space) is 15 nm (solid line), 20 nm (broken line), 30 nm (dotted and dashed line), and 50 nm (double dotted and dashed line). The vertical axis represents a logarithmic scale. The thickness of the electrode layers WL is 30 nm.

In the region where the applied voltage is not less than 1 V, there is not much variation in the current value as a result of differences in the distance between electrode layers WL. However, in the subthreshold region, a difference in the current value of from 1 to 2 orders of magnitude is produced by differences in the distance between electrode layers WL.

In particular, in a cell in the written state where electrons have accumulated in the charge storage film, the threshold voltage is high, and the overdrive voltage from the threshold voltage is low, so the effect of the resistance component of the channel between the electrode layers WL on the cell current is extremely large.

Therefore, according to this embodiment, the step portion is provided in the electrode layer WL, and the columns CL are provided that include the channel body 20 and the memory film 30 that penetrate the step portion.

A region 20a represented by the dotted pattern in the channel body 20 illustrated in FIG. 2 is a region opposing the electrode layer WL via the memory film 30, or is a region in which the electric field of the electrode layer WL is strong. In the state in which a positive voltage is applied to the electrode layer WL, the region 20a is a lower resistance region than the region 20b opposing the space between the electrode layers (the insulating layer between electrode layers).

By forming the step portion 100 in the electrode layer WL, the distance L2 between the bottom surface of the lower step portion 101 of the electrode layer WL and the top surface of the upper step portion 102 of the electrode layer WL one layer below that electrode layer WL is less than the distance L1 between the lower step portions 101 and the distance L1 between the upper step portions 102 of the electrode layers WL.

As a result, in FIG. 2, the distance in the Z direction between the low resistance region 20a opposing the lower step portion 101 of the electrode layer WL of the upper layer and the low resistance region 20a opposing the upper step portion 102 of the electrode layer WL of the layer below becomes closer. Alternatively, the low resistance region 20a opposing the lower step portion 101 of the electrode layer WL of the upper layer overlaps in the Z direction with the low resistance region 20a opposing the upper step portion 102 of the electrode layer WL of the layer below.

In this way, in the state in which a positive voltage is applied to the plurality of electrode layers WL disposed along the direction that current is flowing, it is possible to reduce the resistance of the channel body 20 opposing the region between the electrode layers WL, and it is possible to increase the cell current.

It is possible to achieve a low resistance channel body 20 between the electrode layers WL, by reducing the effective distance between the electrode layers WL that contribute to the formation of the channel, while the distance (thickness of insulating layer between layers) between lower step portions 101 and between upper step portions 102 of different layers that are adjacent to each other in the stacking direction (the Z direction) sandwiching an insulating layer between layers is sufficiently large to maintain insulation between the electrode layers WL.

In the graph in FIG. 7A, considering the subthreshold region, the cell current is increased by approximately one order of magnitude by changing the distance between electrode layers WL from 30 nm to 15 nm. In this embodiment, it is also possible to reduce the effective distance between electrode layers WL that contribute to the formation of channels, so it is possible to increase the cell current.

Next, referring to FIG. 3A to FIG. 5B, a method of forming the memory cell array 1 of the embodiment is described.

Figure 3A:
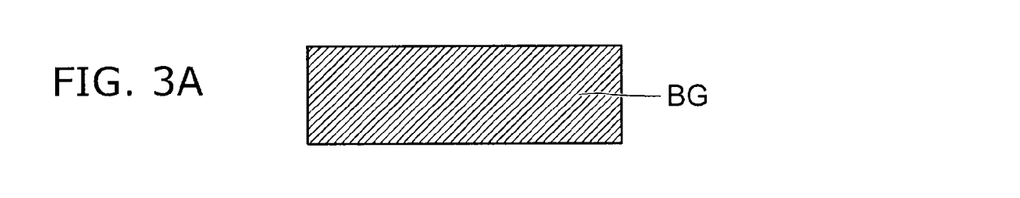

The back gate BG is formed as a lower gate layer on the substrate 10 illustrated in FIG. 1, via an insulating layer. FIG. 3A illustrates the back gate BG only. The back gate BG is a silicon layer to which, for example, boron is added as an impurity.

Next, a silicon oxide film is formed by, for example, the chemical vapor deposition (CVD) method on the top surface of the back gate BG, as a mask material 51. Then, after a resist film is applied on the mask material 51, the resist film is patterned using lithography.

Using the patterned resist film as a mask, the mask material 51 is etched by, for example, reactive ion etching (RIE), and the mask material 51 is patterned.

Figure 3B:
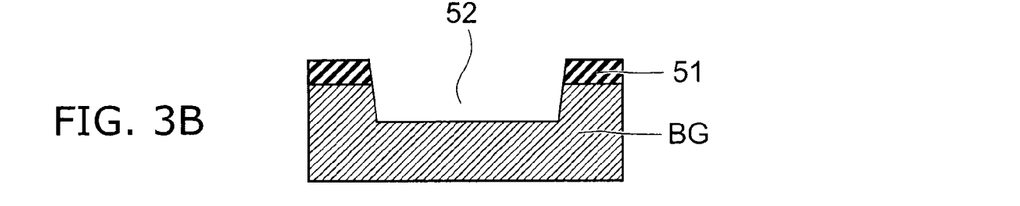

Then, a concave portion 52 is formed in the back gate BG, as illustrated in FIG. 3B, by etching using the patterned mask material 51 as a mask.

Figure 3C:
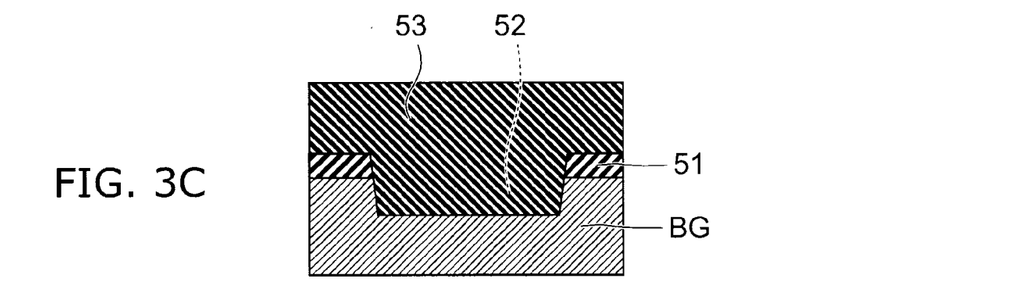

As illustrated in FIG. 3C, a silicon nitride film, for example, is embedded by the CVD method in the concave portion 52, as a sacrificial film 53. The sacrificial film 53 is deposited on the back gate BG via the mask material 51. The inside of the concave portion 52 is completely filled with the sacrificial film 53.

Next, the sacrificial film 53 is etched back by dry etching using the RIE method, or by wet etching using, for example, $H_3PO_4$.

Figure 3D:
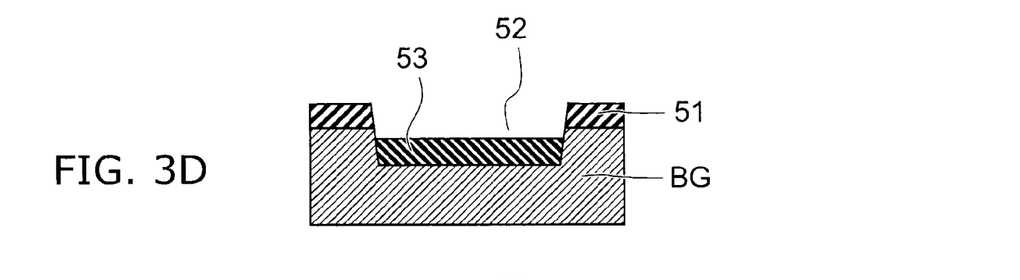

By etching back the sacrificial film 53, the top surface of the sacrificial film 53 is recessed lower than (toward the substrate side) the top surface of the back gate BG, as illustrated in FIG. 3D. Then, the silicon oxide film used as the mask material 51 is removed by wet etching using, for example, hydrofluoric acid.

Figure 3E:
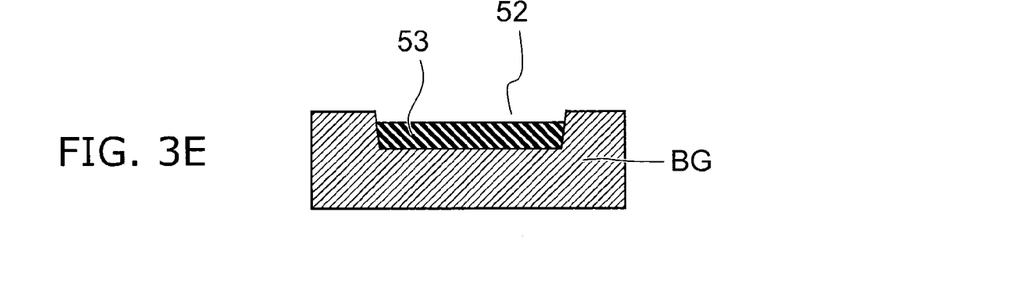

In this way, a step is formed between the top surface of the back gate BG and the top surface of the sacrificial film 53, as illustrated in FIG. 3E.

The plan shape of the concave portion 52 in which the sacrificial film 53 is embedded is formed in, for example, a rectangular shape, and the portion where the step is formed is along the outline of the rectangular plan of the concave portion 52.

Figure 4A:
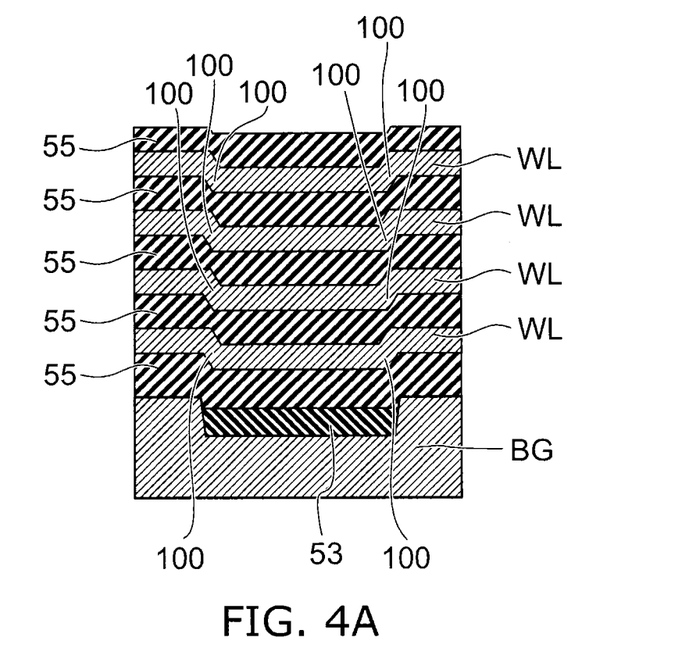

Next, the plurality of the insulating layers 55 and the electrode layers WL are stacked alternately above the sacrificial film 53 and the back gate BG, as illustrated in FIG. 4A. The electrode layers WL are silicon layers to which, for example, boron is added as an impurity. The insulating layers 55 are, for example, silicon oxide layers.

The insulating layers 55 are provided between the electrode layers WL. Also, an insulating layer 55 is provided between the bottommost electrode layer WL and the back gate BG.

Step portions are formed in the insulating layers 55 and the electrode layers WL, reflecting the step formed between the top surface of the back gate BG and the top surface of the sacrificial film 53. The step portion 100 of the electrode layer WL is formed above the step formed between the top surface of the back gate BG and the top surface of the sacrificial film 53.

In the electrode layer WL of each layer, the step portion 100 is formed so that the portion above the sacrificial film 53 is positioned lower than (toward the back gate BG side of) the portion above the region where the sacrificial film 53 is not formed (above a convex portion of the back gate BG).

In the electrode layer WL, the portions other than the step portion 100 are deposited parallel to the top surface of the back gate BG, and are not inclined.

Figure 4B:
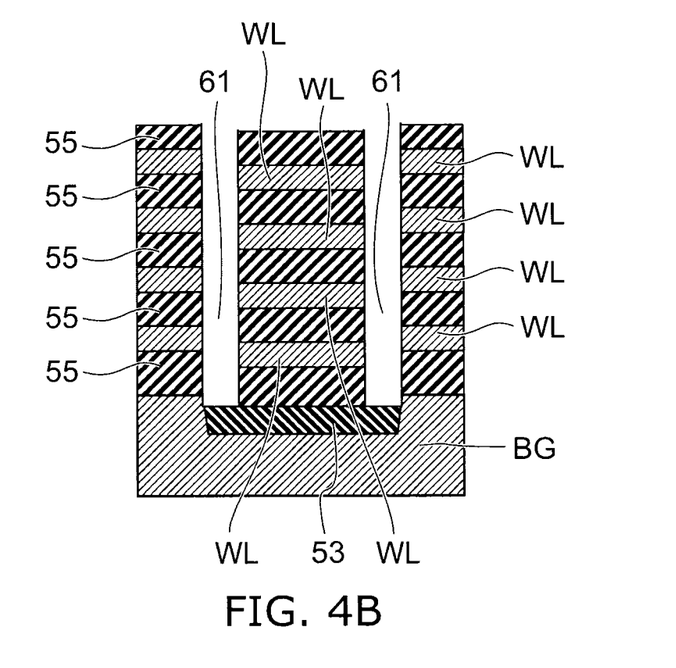

After the stacked body that includes the electrode layers WL and the insulating layers 55 has been formed, a hole 61 is formed penetrating the stacked body to reach the sacrificial film 53, as illustrated in FIG. 4B. A pair of holes 61 is formed for every one concave portion (sacrificial film 53). The hole 61 is formed by the RIE method using a mask which is not illustrated on the drawings formed on the stacked body.

The hole 61 passes through the step portion 100 of the electrode layer WL and the portion where the step portion is formed in the insulating layers 55, to reach the sacrificial film 53. The sacrificial film 53, which is a different material from the electrode layer WL and the insulating layer 55, functions as an etching stopper for the etching to form the hole 61.

Then, by etching through the hole 61, the sacrificial film 53 is removed. For example, the sacrificial film 53 is removed by wet etching using $H_3PO_4$.

Figure 5A:
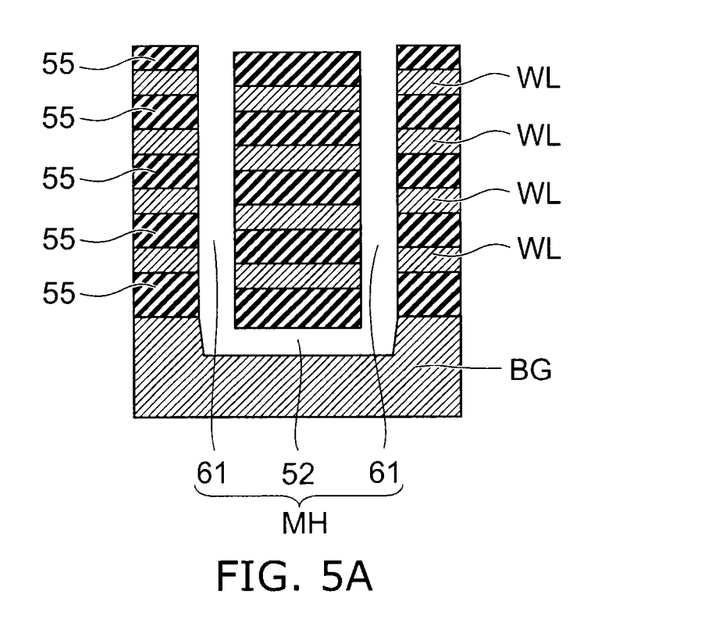
Figure 5B:
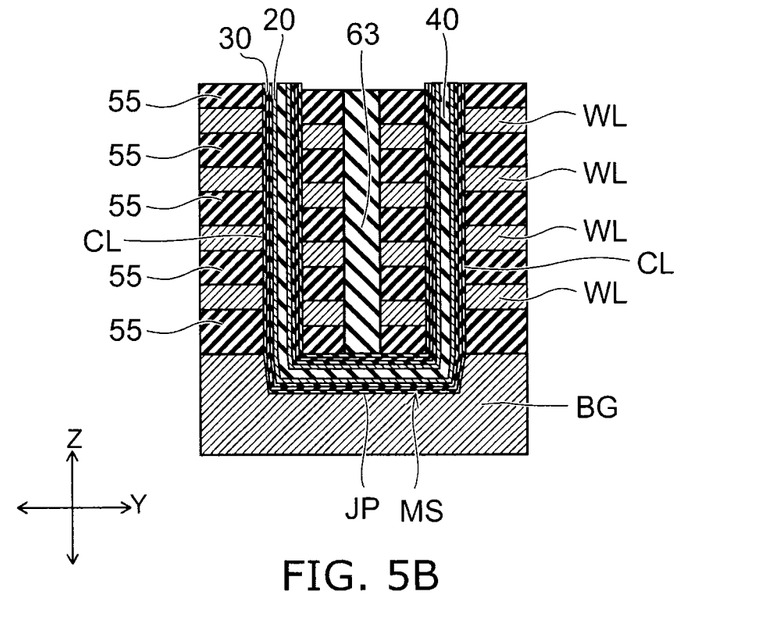

By removing the sacrificial film 53, the concave portion 52 formed in the back gate BG appears, as illustrated in FIG. 5A. The pair of holes 61 is connected to the concave portion 52 at their bottom ends, forming the U-shaped memory hole MH in the back gate BG and the stacked body on the back gate BG.

The memory film 30 described above is formed on the inside walls of the memory hole MH, as illustrated in FIG. 5B, and the channel body 20 is formed on the inside walls of the memory film 30. In addition, the core insulating film 40 is embedded on an inner side of the channel body 20.

Then, a slit is formed in the stacked body above the connecting portion JP which is the bottom of the U-shaped memory string MS, and an insulating separation film (for example a silicon nitride film) 63 is embedded within the slit. The stacked bodies are separated in the first direction (Y direction) by the insulating separation film 63.

Then, the drain side selection gate SGD and the source side selection gate SGS illustrated in FIG. 1 are formed above the stacked body illustrated in FIG. 5B. Then, the gate insulating film of the select transistors STD, STS, the channel bodies, and the like are formed, and the source line SL, the bit line BL and the like are formed.

Figure 6A:
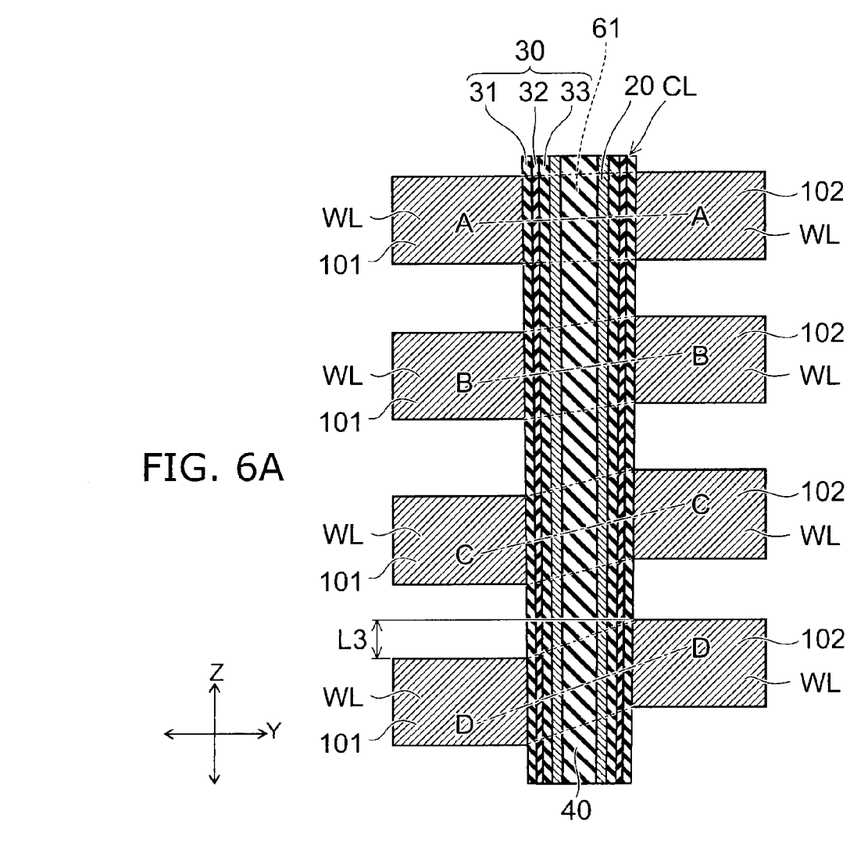
FIGS. 6A to 6E are schematic cross-sectional views of the semiconductor memory device according to the embodiment.

Next, FIG. 6A is a schematic cross-sectional view of a memory cell according to another embodiment.

Figure 6B:
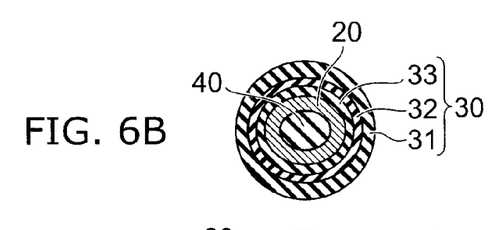
Figures 6C, 6D, 6E:
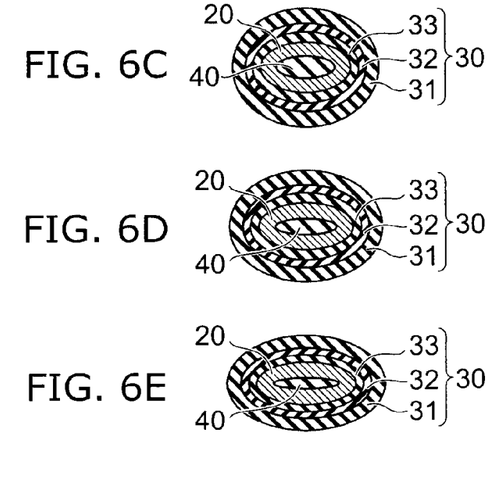

FIG. 6B is a cross-sectional view at A-A in FIG. 6A.
FIG. 6C is a cross-sectional view at B-B in FIG. 6A.
FIG. 6D is a cross-sectional view at C-C in FIG. 6A.
FIG. 6E is a cross-sectional view at D-D in FIG. 6A.

FIG. 6A corresponds to a cross-section parallel to the YZ plane in FIG. 1, and illustrates a cross-section of a portion where a single column CL passes through the stacked body. Also, the insulating layers between the electrode layers WL have been omitted from FIG. 6A.

The cross-section in FIG. 6B is a cross-section of the column CL sectioned through the line A-A that connects the central portion in the film thickness direction of the surface where the lower step portion 101 of the first electrode layer WL from the top as illustrated in FIG. 6A contacts the column CL, and the central portion in the film thickness direction of the surface where the upper step portion 102 of the same first electrode layer WL from the top contacts the column CL.

The cross-section in FIG. 6C is a cross-section of the column CL sectioned through the line B-B that connects the central portion in the film thickness direction of the surface where the lower step portion 101 of the second electrode layer WL from the top as illustrated in FIG. 6A contacts the column CL, and the central portion in the film thickness direction of the surface where the upper step portion 102 of the same second electrode layer WL from the top contacts the column CL.

The cross-section in FIG. 6D is a cross-section of the column CL sectioned through the line C-C that connects the central portion in the film thickness direction of the surface where the lower step portion 101 of the third electrode layer WL from the top as illustrated in FIG. 6A contacts the column CL, and the central portion in the film thickness direction of the surface where the upper step portion 102 of the same third electrode layer WL from the top contacts the column CL.

The cross-section in FIG. 6E is a cross-section of the column CL sectioned through the line D-D that connects the central portion in the film thickness direction of the surface where the lower step portion 101 of the fourth electrode layer WL from the top as illustrated in FIG. 6A contacts the column CL, and the central portion in the film thickness direction of the surface where the upper step portion 102 of the same fourth electrode layer WL from the top contacts the column CL.

When the hole 61 illustrated in FIG. 4B is formed by the RIE method, the sidewalls of the hole 61 are frequently tapered and inclined with respect to the major surface of the substrate, so the diameter of the hole on the upper layer side is larger, and the diameter of the hole on the lower layer side is smaller.

In the memory cell on the upper layer side where the hole diameter is large, the radius of curvature of the column CL is large, so it is difficult for the electric field to form in the tunnel film 33, so the speed of writing and erasing may be slower than the lower layer side. Also, in the memory cells on the lower layer side where the hole diameter is small, the radius of curvature of the column CL is small, so it is easy for the electric field to form in the tunnel film 33, so the speed of writing and erasing may be faster than the upper layer side.

The difference in the writing and erasing speed between the upper layer side and the lower layer side results in a poorer writing distribution width, so it is desirable that the speed of writing and erasing is uniform from the top layer to the bottom layer.

In the embodiment illustrated in FIG. 6A, the diameter of the hole 61 in the lower portion side is smaller than that in the upper portion side due to the process of forming the hole 61. In other words, the column CL is narrower on the lower layer side than the upper layer side.

In other words, the distance in the Y direction between the lower step portion 101 and the upper step portion 102 at the electrode layer WL on the lower layer side is less than the distance in the Y direction between the lower step portion 101 and the upper step portion 102 at the electrode layer WL on the upper layer side.

Also, the step is formed in the base material on which the plurality of electrode layers WL is stacked, as illustrated in FIG. 3E. By stacking the plurality of electrode layers WL above the base material, steps are formed in the electrode layers WL reflecting the step of the base material. Depending on the film forming conditions and the number of electrode layers WL at this time, the step is reduced the higher the electrode layer WL, so it is possible to reduce the size of the step.

In other words, as illustrated in FIG. 6A, it is possible to form a structure in which the step of the step portion is larger on the lower layer side of the plurality of electrode layers WL than on the upper layer side. In other words, the step between the lower step portion 101 and the upper step portion 102 of the electrode layer WL on the lower layer side is greater than the step between the lower step portion 101 and the upper step portion 102 of the electrode layer WL on the upper layer side.

When the step between the lower step portion 101 and the upper step portion 102 is large, the cross-section of the column CL sectioned through a line that connects the central portion in the film thickness direction of the lower step portion 101 and the central portion in the film thickness direction of the upper step portion 102 is an elliptical shape.

The cross-section of the column CL sectioned through a line that connects the central portion in the film thickness direction of the lower step portion 101 and the central portion in the film thickness direction of the upper step portion 102 is a portion where the electric field of the electrode layer WL is strong in the column CL of each memory cell. When the cross-section is an elliptical shape, forming a portion where the curvature is gentle (the curvature radius is large), the electric field in the column CL is reduced.

In other words, the larger the step of the electrode layer WL in the lower layers, the average electric field in the whole tunnel film 33 becomes weaker, so it is possible to cancel out the effect of the faster writing and erasing speed on the lower layer side where the diameter of the hole is smaller.

Figure 8:
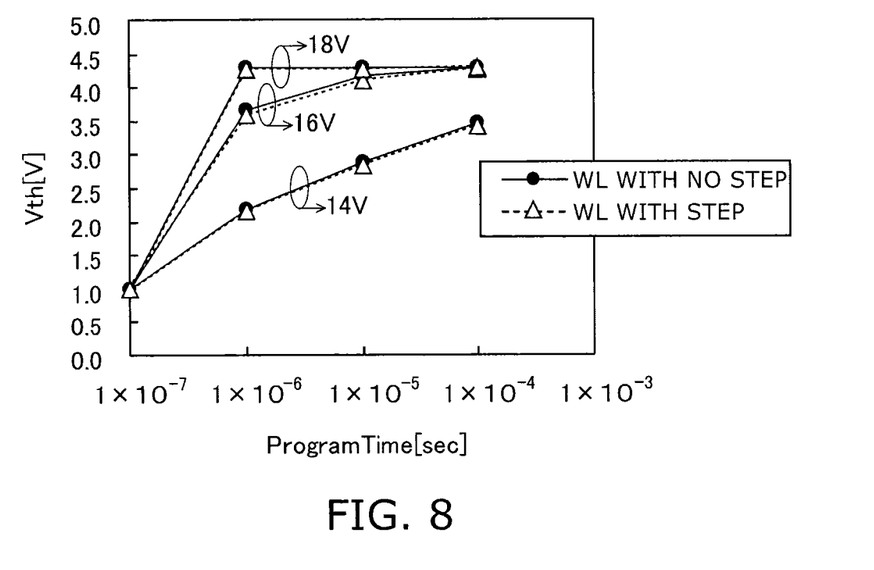
FIG. 8 is a graph showing the simulation results of the writing characteristics in a structure where the electrode layer has a step and a structure with no step.

FIG. 8 is a graph showing the results of a simulation of the writing characteristics in a structure where the electrode layer WL has a step and a structure with no step.

The horizontal axis represents the program time (seconds), and the vertical axis represents the threshold voltage (V) of the memory cell.

The solid line is the structure with no step in the electrode layer WL, and the broken line is a structure with a step in the electrode layer WL, and results are shown for a writing voltage of 14 V, 16 V, and 18 V in both cases.

In the structure used in the simulation, the memory hole diameter was 50 nm, the thickness of the electrode layer WL was 35 nm, the distance between electrode layers WL was 25 nm, the film thickness of the memory film 30 was 18.5 nm, and the step (L3 in FIG. 6A) of the electrode layer WL was 30 nm.

From the simulation results, it can be seen that the writing speed is slightly slower in a structure with a step than in a structure with no step.

Therefore, the variation in the writing and erasing speed between the upper layer side and the lower layer side due to the difference in the hole diameter and the variation in the writing and erasing speed between the upper layer side and the lower layer side due to the differences in the size of the step of the electrode layer WL cancel each other out, and as a result, it is possible to achieve a uniform writing and erasing speed from the top layer to the bottom layer.

In the embodiment as described above, the U-shaped memory string in which the bottom ends of the pair of columns are connected within the back gate BG which is the lower gate layer was described. However, the memory string may be formed with an I-shaped straight structure that passes through the lower gate layer (lower portion selection gate), the stacked body that includes the plurality of electrode layers stacked on the lower gate layer, and the upper portion gate layer (upper portion selection gate) provided on the stacked body.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor memory device, comprising:
a lower gate layer;

a stacked body including a plurality of electrode layers and a plurality of insulating layers, alternately stacked on the lower gate layer;

a channel body extending within the stacked body from the topmost electrode layer to the lower gate layer; and a memory film provided between the electrode layer and the channel body, the memory film including a charge storage film, wherein the plurality of electrode layers has a first electrode layer and a second electrode layer below the first electrode layer, each of the first electrode layer and the second electrode layer including a lower step portion, an upper step portion, and an intermediate portion between the lower step portion and the upper step portion, the channel body and the memory film extending in the intermediate portion in a stacking direction of the stacked body, and a first distance between a bottom surface of the lower step portion of the first electrode layer and a top surface of the upper step portion of the second electrode layer is less than a second distance between the lower step portion of the first electrode layer and the lower step portion of the second electrode layer, and between the upper step portion of the first electrode layer and the upper step portion of the second electrode layer.

2. The device according to claim 1, wherein the lower step portions of the plurality of electrode layers are stacked via the insulating layer, and the upper step portions of the plurality of electrode layers are stacked via the insulating layer.

3. The device according to claim 1, wherein a top surface and a bottom surface of the lower step portion and a top surface and a bottom surface of the upper step portion are parallel to a top surface of the lower gate layer.

4. The device according to claim 1, wherein
the step portion has a first step portion and a second step portion, the second step portion not aligning with the first step portion in the stacking direction; and
the channel body includes:
a first column penetrating the first step portion,
a second column penetrating the second step portion, and
a connecting portion provided in the lower gate layer, and connecting bottom end parts of the first column and the second column.

5. The device according to claim 4, wherein a first height of the electrode layer above the connecting portion is lower than a second height of the electrode layer above a region where the connecting portion is not provided.

6. The device according to claim 4, wherein the electrode layer is separated between the pair of columns.

7. The device according to claim 1, wherein the electrode layer is a silicon layer to which an impurity has been added, and
the channel body is a silicon film whose impurity concentration is lower than an impurity concentration of the electrode layer.

8. The device according to claim 1, wherein the channel body is provided with a cylindrical shape, and
a periphery of the channel body is surrounded by the electrode layer via the memory film.

9. The device according to claim 1, wherein a top surface of the lower step portion is lower than a top surface of the upper step portion, and a bottom surface of the lower step portion is lower than a bottom surface of the upper step portion.

10. A semiconductor memory device, comprising:
a lower gate layer;
a stacked body including a plurality of electrode layers and a plurality of insulating layers, alternately stacked on the lower gate layer;
a channel body extending within the stacked body from the topmost electrode layer to the lower gate layer; and
a memory film provided between the electrode layer and the channel body, the memory film including a charge storage film, wherein
the plurality of electrode layers has a first electrode layer and a second electrode layer below the first electrode layer, each of the first electrode layer and the second electrode layer including a lower step portion, an upper step portion, and an intermediate portion between the lower step portion and the upper step portion, the channel body and the memory film extending in the intermediate portion in a stacking direction of the stacked body,
a column including the channel body and the memory film is narrower on the second electrode layer side than the first electrode layer side, and
a first step between the lower step portion and the upper step portion of the second electrode layer is greater than a second step between the lower step portion and the upper step portion of the first electrode layer.

11. The device according to claim 10, wherein a cross-section shape of the channel body and the memory film sectioned through a line that connects a central portion in a film thickness direction of the lower step portion and a central portion in a film thickness direction of the upper step portion in the same electrode layer is an elliptical shape.

* * * * *